United States Patent [19]

Watanabe

[11] Patent Number: 5,406,591
[45] Date of Patent: Apr. 11, 1995

[54] FREQUENCY SYNTHESIZER AND FREQUENCY SYNTHESIZING METHOD

[75] Inventor: Nozomu Watanabe, Tokyo, Japan

[73] Assignee: NEC Corporation, Tokyo, Japan

[21] Appl. No.: 24,232

[22] Filed: Mar. 1, 1993

[30] Foreign Application Priority Data

Feb. 29, 1992 [JP] Japan .................................. 4-079278
May 28, 1992 [JP] Japan .................................. 4-137138

[51] Int. Cl.$^6$ ............................................. H03D 3/24
[52] U.S. Cl. ..................................... 375/120; 375/119; 331/1 A
[58] Field of Search ............... 375/119, 120; 331/1 A, 331/14, 17, 25; 328/16, 25, 30, 55

[56] References Cited

U.S. PATENT DOCUMENTS

| | | | |
|---|---|---|---|
| 4,849,704 | 7/1989 | Thornton | 375/120 |
| 4,980,899 | 12/1990 | Troost et al. | 375/120 |
| 5,028,885 | 7/1991 | Voigt et al. | 331/1 A |
| 5,052,031 | 9/1991 | Molloy | 375/120 |
| 5,197,086 | 3/1993 | Jackson et al. | 375/119 |

Primary Examiner—Stephen Chin
Attorney, Agent, or Firm—Foley & Lardner

[57] ABSTRACT

A frequency synthesizer and a frequency synthesizing method are disclosed. They are used to achieve frequency switching in a short time even though the switched width of an output frequency signal from the frequency synthesizer is narrow. A gate pulse generator circuit generates a gate pulse signal using a frequency division number data activation signal upon setting the output frequency from the frequency synthesizer. A gate circuit interrupts a reference frequency signal over a predetermined time interval with the aid of the gate pulse signal and thereafter drives a voltage-controlled oscillator to oscillate at a new frequency with the aid of a phase comparator, a charge pump circuit, and a low-pass filter.

6 Claims, 4 Drawing Sheets

FREQUENCY SYNTHESIZER AND FREQUENCY SYNTHESIZING METHOD

BACKGROUND OF THE INVENTION

1. Field of the Invention

The present invention relates to a PLL (Phase Locked Loop) frequency synthesizer and a frequency synthesizing method, and more specifically to a frequency synthesizer applicable to channel switching in mobile communication systems, wherein rapid responsibility to the switching of frequencies is required.

2. Description of the Prior Art

Referring to FIG. 1, a prior art frequency synthesizer is comprised of a voltage-controlled oscillator 3 capable of outputting a desired frequency signal 2 based upon control voltage 1, a variable frequency divider which inputs a frequency division number data signal 5 generated from a control section 4, and a frequency division number data activation signal 6 and frequency-divides frequency signal 2, a reference for oscillator 9 for outputting a reference frequency signal 8, a phase comparator 16 for comparing phases of a comparison signal 13 outputted from the variable frequency divider 7 and of the reference frequency signal 8 and outputting a pulse signal 15 which is to charge and discharge the control voltage I responsibly to a phase difference between the foregoing signals such that the phase difference is coincident with each other, a charge pump circuit 17 for actually performing charging/discharging actions based upon the pulse signal 15, and a low-pass filter 19 for integrating an output 18 from the charge pump to supply the control voltage 1 to the voltage-controlled oscillator 3. With the arrangement described above, referring to FIGS. 2 and 3, channel switching is achieved upon the output frequency being switched over from $f_0$ to $f_1$ during a predetermined time since a time point $t_1$, by issuing the frequency division number data 5 corresponding to $f_1$ before the time point $t_1$ and issuing the frequency division number data activation signal 6 at the time point.

Such prior art frequency synthesizers, however, often suffer from a difficulty that the phase comparator 16 for use in a PLL circuit becomes severely insensitive as a phase difference between the inputted reference frequency signal 8 and the comparison signal 13 is very small. More specifically, the phase comparator 16 has a slight initial phase difference when a switched frequency width is narrow and hence the sensitivity of the phase comparator 16 is severely lowered because of the slight initial phase difference. This causes delayed detection of such a phase difference and results in a delayed initial response to the frequency switching, accompanied by a severely lengthened switching time. FIGS. 2 and 3 demonstrate responses of a prior art frequency synthesizer, in comparison, in cases where the switching width is wide and is narrow respectively.

SUMMARY OF THE INVENTION

To solve the problems with the prior art, it is an object of the present invention to provide a frequency synthesizer including means for achieving frequency switching in a short time even with the narrow width of switching of an output frequency.

It is another object of the present invention to provide a frequency synthesizing method.

To achieve the first object, a frequency synthesizer of the present invention comprises a voltage-controlled oscillator for switching an oscillation frequency to a frequency signal of a desired frequency based upon predetermined control voltage and outputting said frequency signal, a control section for generating a frequency division number signal corresponding to said desired frequency to be switched and a frequency division number data activation signal for activating said frequency division number data signal, a variable frequency divider for frequency-dividing a given frequency signal responsibly to the frequency division number data signal activated by the frequency division number data activation signal and generating a comparison signal, a reference oscillator for generating a pulse signal, a charge pump circuit for charging/discharging electric charges in conformity with a pulse signal, and a low-pass filter for feeding control voltage yielded by integrating an output signal from the charge pump circuit to said voltage-controlled oscillator, the improvement being such that it further comprises a gate pulse generator circuit for generating a predetermined width gate pulse signal responsibly to the frequency division number data activation signal, and a gate circuit for generating a reference gate signal by opening and closing the reference frequency signal from the reference oscillator responsibly to the gate pulse signal, said phase comparator including means for continuously generating the pulse signal until the phase of the comparison signal and the phase of the reference gate signal are coincident with each other, by comparing said two phases.

To achieve the second object, a frequency synthesizing method according to the present invention comprises switching an oscillation signal to a frequency signal of a desired frequency, based on predetermined control voltage and outputting the frequency signal as the oscillation signal, frequency dividing said frequency signal responsibly to frequency division number data signal corresponding to said desired frequency to be switched to generate a comparison signal, gating said reference frequency signal for a predetermined time interval simultaneously with the activation of said frequency division number data signal to generate a reference gate signal, generating a pulse signal over a predetermined time interval until the phases of these signals are coincident with each other based upon the generated reference gate signal and the comparison signal, and generating said desired frequency signal based upon the generated pulse signal.

In accordance with the present invention, upon setting the frequency of the frequency synthesizer the gate pulse signal is generated from the gate pulse generator circuit using the frequency division number activation signal, with which gate pulse signal the gate circuit is controlled to interrupt the generation of the reference frequency signal over a predetermined time interval, and thereafter switching is performed. Hereby, even though the switching width of the output frequency is narrow, there can be eliminated the affection of the lowering of the sensitivity band possessed by the phase comparator, and there can be achieved the switching in a short time.

BRIEF DESCRIPTION OF THE DRAWINGS

The above and other objects, features and advantages of the present invention will become more apparent from the following description when taken in conjunction with the accompanying drawings in which preferred embodiments of the present invention are shown by way of illustrative example.

DETAILED DESCRIPTION OF THE PREFERRED EMBODIMENTS

In what follows, an embodiment of a frequency synthesizer according to the present invention will be described with reference to the accompanying drawings.

Figure 1:
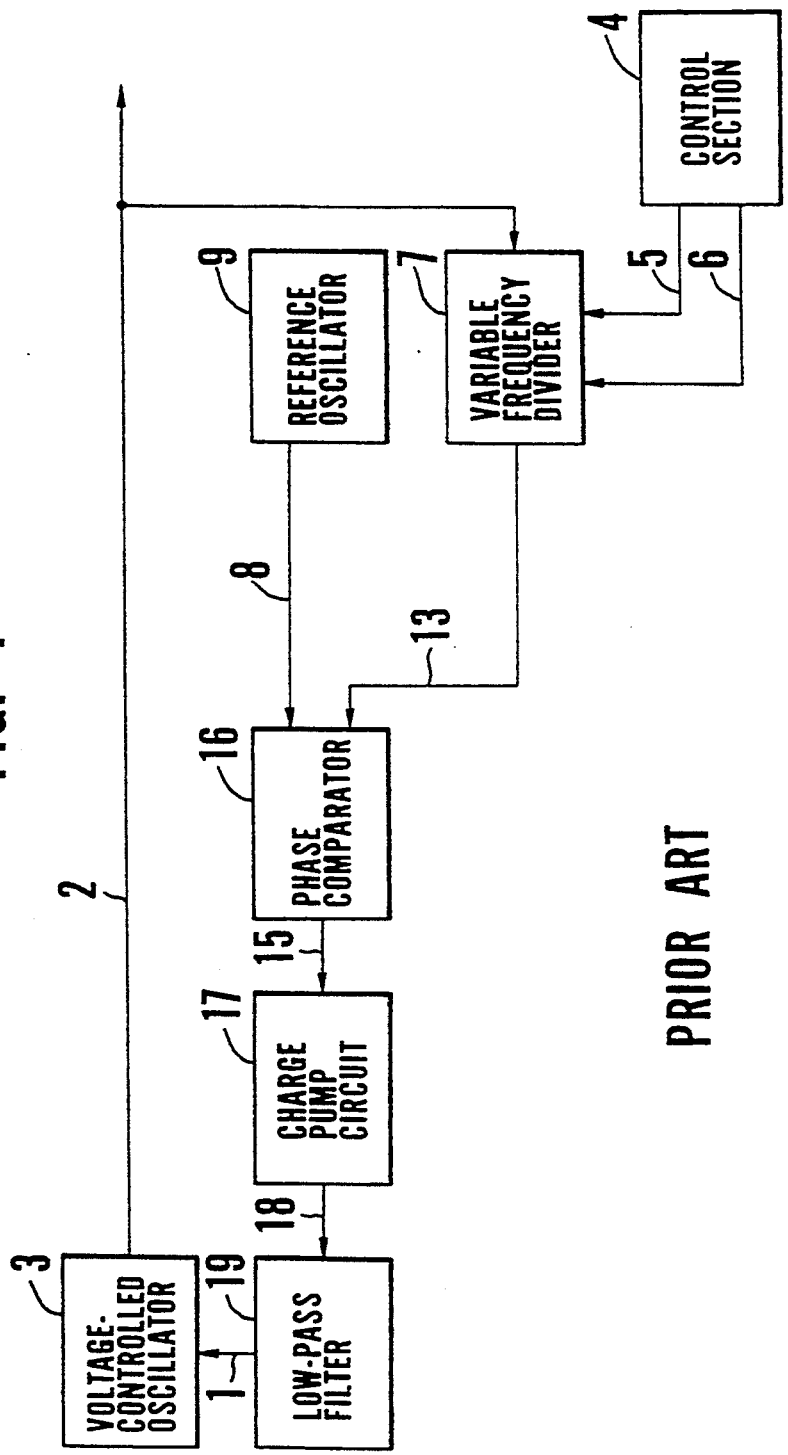
FIG. 1 is a block diagram of the arrangement of a prior art frequency synthesizer.
Figure 2:
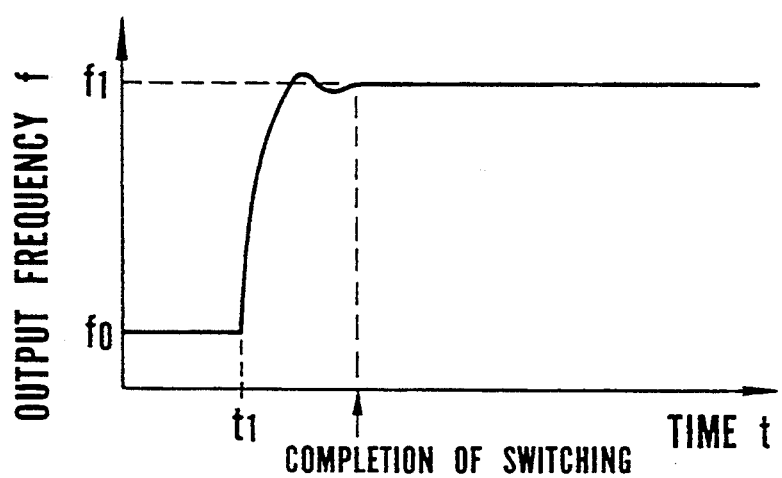
FIG. 2 is a view illustrating a waveform of the prior art frequency synthesizer of FIG. 1 as an output response of the same in the case of a switching width being wider.
Figure 3:
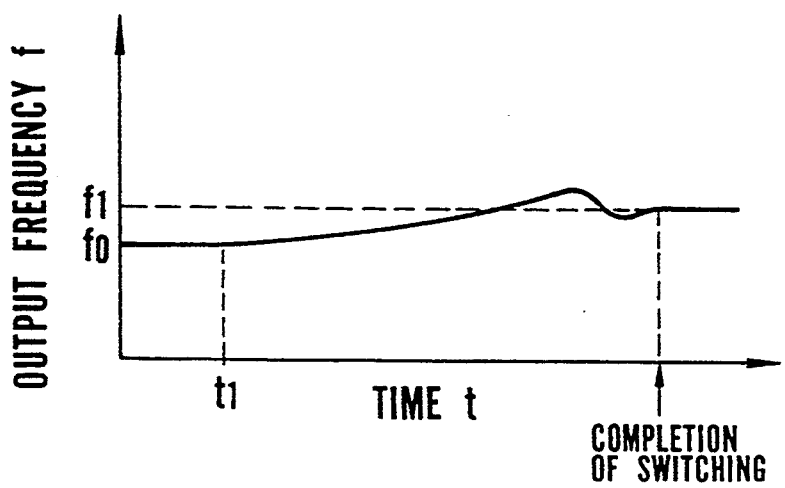
FIG. 3 is a view illustrating an identical waveform to that of FIG. 2 but in the case of the switching width being narrower.
Figure 4:
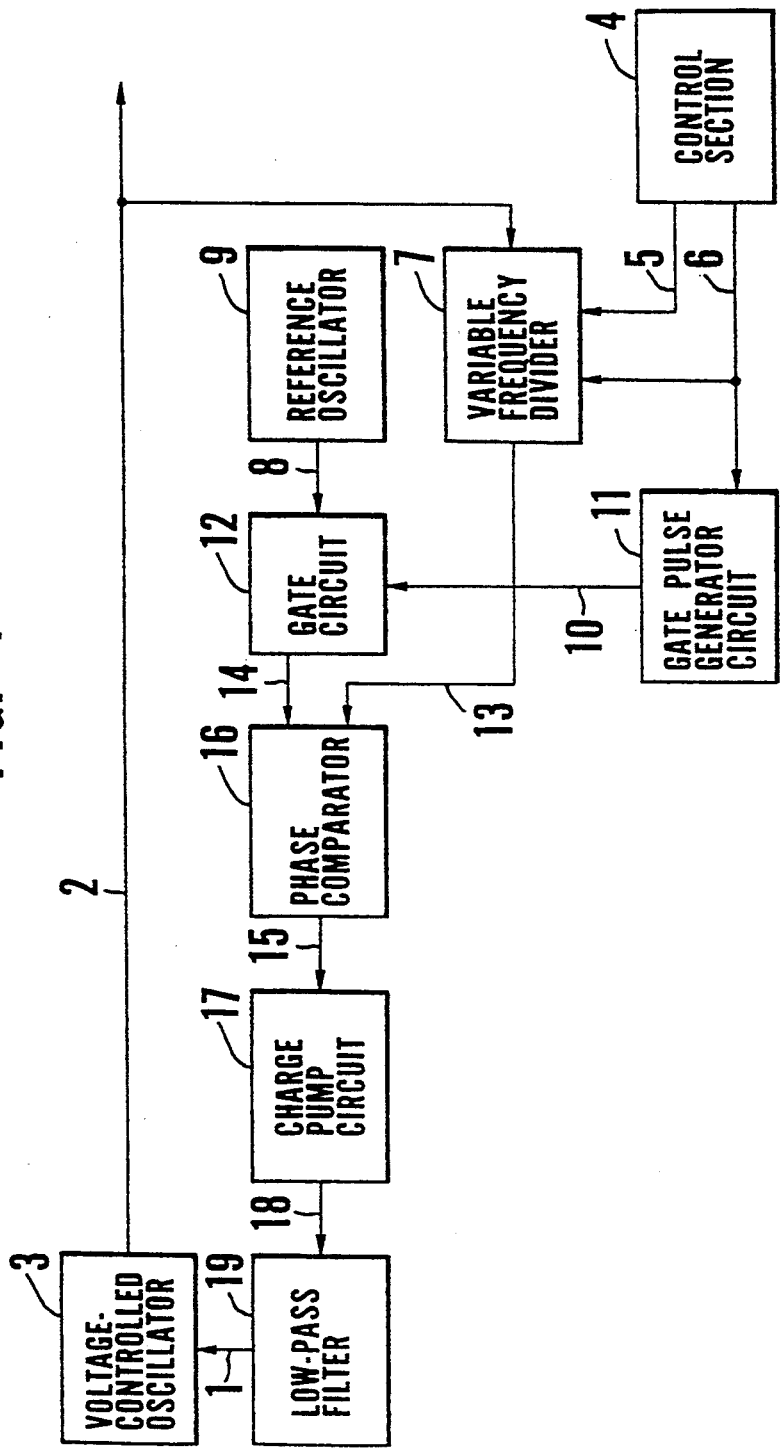
FIG. 4 is a block diagram of the arrangement of an embodiment of a frequency synthesizer according to the present invention.
Figure 5:
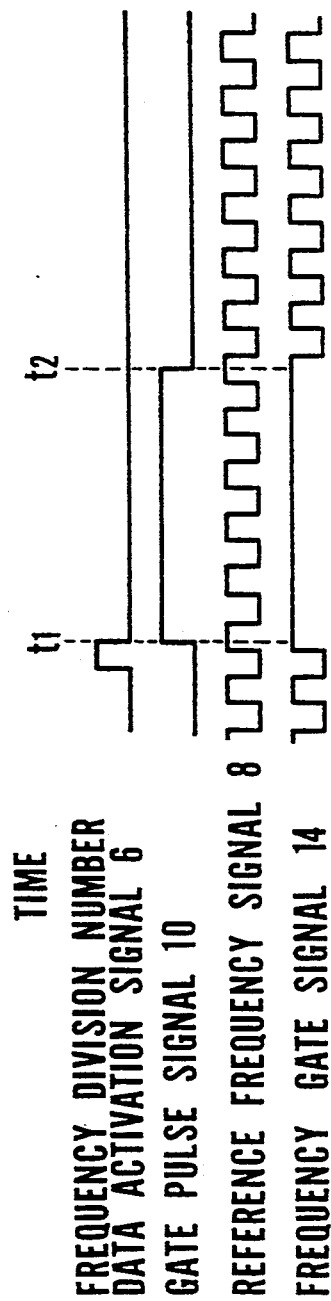
FIG. 5 is a timing chart illustrating waveforms of signals at portions of the frequency synthesizer of FIG. 4.

Referring to FIG. 4, there is demonstrated a block diagram of the arrangement of the present invention.

The present embodiment comprises a voltage-controlled oscillator 3 for switching its oscillation frequency to a frequency signal 2 of a desired frequency based upon predetermined control voltage 1 and outputting the frequency signal 2, a control section 4 for generating a frequency division number data signal 5 corresponding to the desired frequency to be switched and a frequency division number activation signal 6 to the frequency division number data signal 5, a variable frequency divider 7 for generating a comparison signal 13 by frequency-dividing the frequency signal 2 responsibly to the frequency division number data signal 5 activated by the frequency division number data activation signal 6, a reference oscillator 9 for generating a reference frequency signal 8, a phase comparator 16 for generating a phase signal 15, a charge pump circuit 17 for charging/discharging electric charges on the basis of the pulse signal 15, and a low-pass filter 19 for feeding to the voltage-controlled oscillator 3 the control voltage 1 yielded by integrating a signal 18 outputted from the charge pump circuit 17. The present embodiment further comprises, as means manifesting the features of the present invention, a gate pulse generator circuit 11 for generating a gate pulse signal 10 with a predetermined width responsibly to the frequency division number data activation signal 6 and a gate circuit 12 for generating a reference frequency signal 8 from the reference oscillator 9 responsibly to the gate signal 10, and the phase comparator 16 includes means for continuously generating the phase signal 15 by comparing the phases of the comparison signal 13 and of the reference gate signal 14 until those phases are coincident with each other.

Operation of the present embodiment is as follows.

As can be understood from FIG. 4, the present embodiment demonstrates a PLL frequency synthesizer which is comprised of the voltage-controlled oscillator 3, variable frequency divider 7, phase comparator 16, charge pump circuit 17, and low-pass filter 19, wherein the output frequency is switched by making valid the frequency division number data signal 5 generated by the control section with the aid of the frequency division number data activation signal 6, the frequency switching operation is initiated with the frequency division number data activation signal 6, while the frequency division number data activation signal 6 is also inputted to the gate pulse generator circuit 11 and is converted therein to the predetermined width gate pulse signal 10. The reference frequency signal 8, the output from the reference oscillator 9 passes through the gate circuit 12 which is opened/closed by the foregoing gate pulse signal 10 and is inputted to the phase comparator 16 as the reference gate signal 14. Whilst the gate of the gate circuit 12 has been closed, the reference gate signal 14 is seemed by the phase comparator 16, as being completely delayed in the phase thereof with respect to the comparison signal 13. The charge pump circuit 17 accordingly performs charging operation and hence the frequency signal 2 responses at once in the direction of higher frequencies. Although the operation returns to ordinary switching operation after the gate to the reference frequency signal 8 is opened, the output frequency at that time have become enough higher, which eliminates the narrowing of the switched frequency width and thus eliminates the affection of the insensitive band of the phase comparator.

Figure 6:
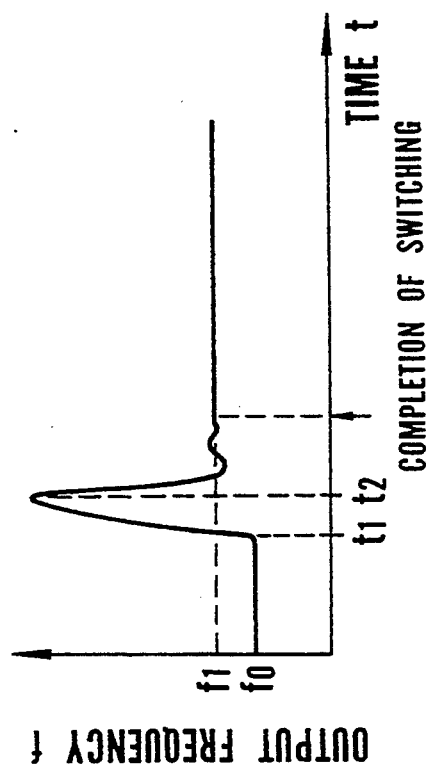
FIG. 6 is a waveform illustrating an output response in the embodiment of FIG. 4.

Referring to FIG. 6, there is illustrated in an exemplified manner the gate pulse signal 10 and an output response of the present embodiment, where t1-t2 is a time interval during which the gate has been closed.

According to the present invention, as described above, upon setting the output frequency the reference frequency signal is gated within a predetermined time interval to forcedly enhance the initial phase difference upon the frequency switching. Hereby, use is made of the please comparator, avoiding the insensitive band of the same, and thus the frequency switching is complete only ir a short time irrespective of the switched frequency width.

What is claimed is:

1. A frequency synthesizer comprising;
    voltage-controlled oscillator means for generating a frequency signal whose frequency is switched to a desired frequency based upon a predetermined control voltage to be inputted thereto;
    reference oscillator means for generating a reference frequency signal;
    variable frequency divider means for frequency dividing the frequency signal received from said voltage-controlled oscillator means in response to a frequency division number data signal corresponding to the desired frequency to be switched to generate a comparison signal;
    reference gate signal means connected to said reference oscillator means for gating the reference frequency signal from said reference oscillator means for a predetermined time interval in response to a frequency division number data activation signal to generate a reference gate signal;
    phase comparator means connected to said variable frequency divider means and said reference gate signal means for allowing the reference gate signal from the reference gate signal means and the comparison signal from said variable frequency divider means to be inputted thereinto and thereby generating a pulse signal over a predetermined time interval until the phases of said reference gate signal and said comparison signal are coincident with each other; and voltage generator means connected to said voltage-controlled oscillator means and said phase comparator means for generating said predetermined control voltage to drive said voltage-controlled oscillator means to generate said desired frequency signal based upon said pulse signal generated from said phase comparator means.

2. A frequency synthesizer according to claim 1 further comprising control means for generating said frequency division number data signal and a frequency division number data activation signal.

3. A frequency synthesizer according to claim 2 wherein said reference gate signal means includes gate pulse generator means for generating a gate pulse on the basis of the frequency division number data activation signal from said control means, and gate means for gating the reference frequency signal from said reference oscillator means for a predetermined time interval on the basis of the gate pulse from said gate pulse generator means to generate a reference gate signal.

4. A frequency synthesizer according to claim 1 wherein said voltage generator means includes charge pump means connected to said phase comparator means for performing charging/discharging operations based upon the pulse signal from the phase comparator means, and filter means connected to said charge pump means and said voltage-controlled oscillator means for integrating the output from said charge pump means and supplying a resulting integrated signal to said voltagecontrolled oscillator means.

5. A frequency synthesizer according to claim 4 wherein said filter means is a low-pass filter.

6. A frequency synthesizing method comprising:
switching an oscillation signal to a frequency signal of a desired frequency, based on predetermined control voltage and outputting the frequency signal as the oscillation signal;
frequency dividing said frequency signal in response to a frequency division number data signal corresponding to said desired frequency to be switched to generate a comparison signal;
gating a reference frequency signal for a predetermined time interval in response to said frequency division number data signal to generate a reference gate signal;
generating a pulse signal over a predetermined time interval until the phases of the reference gate signal and the comparison signal are coincident with each other based upon the generated reference gate signal and the comparison signal; and
generating said desired frequency signal based upon the generated pulse signal.

* * * * *